United States Patent
Wan et al.

(10) Patent No.: US 8,416,107 B1
(45) Date of Patent: Apr. 9, 2013

(54) CHARGE COMPENSATION CALIBRATION FOR HIGH RESOLUTION DATA CONVERTER

(75) Inventors: Kam Chuen Wan, Hong Kong (HK); Yat To (William) Wong, Hong Kong (HK); Ho Ming (Karen) Wan, Hong Kong (HK); Kwai Chi Chan, Hong Kong (HK)

(73) Assignee: Hong Kong Applied Science & Technology Research Institute Company Ltd., Hong Kong (HK)

( * ) Notice: Subject to any disclaimer, the term of this patent is extended or adjusted under 35 U.S.C. 154(b) by 37 days.

(21) Appl. No.: 13/247,119

(22) Filed: Sep. 28, 2011

(51) Int. Cl.
*H03M 1/10* (2006.01)
(52) U.S. Cl.
USPC .......................................... 341/120; 341/155
(58) Field of Classification Search .................. 341/120, 341/155, 172, 118, 119, 121, 135
See application file for complete search history.

(56) References Cited

U.S. PATENT DOCUMENTS

| | | |
|---|---|---|
| 5,684,487 A | 11/1997 | Timko |
| 7,741,981 B1 | 6/2010 | Wan et al. |
| 7,812,757 B1 * | 10/2010 | Wong et al. ................... 341/172 |

OTHER PUBLICATIONS

Lee, Hae-seung, and Hodges, David A., "Self-calibration Technique for A/D Converters", IEEE Trans. Circuit and Systems, vol. CAS-30, No. 3, pp. 188-190, Mar. 1983.

* cited by examiner

*Primary Examiner* — Joseph Lauture
(74) *Attorney, Agent, or Firm* — Stuart T. Auvinen; gPatent LLC.

(57) ABSTRACT

A calibrating Analog-to-Digital Converter (ADC) has an X-side array with binary-weighted capacitors that connect to an X-side line and a Y-side array connected to a Y-side line. Each array has binary-weighted capacitors from a most-significant-bit (MSB) to a least-significant-bit (LSB), but the LSB capacitor is duplicated as a termination capacitor and a middle capacitor between upper and lower groups is also duplicated as a surrogate capacitor. During calibration, lower array capacitors are switched low while the upper capacitors are driven by a thermometer-code value on both X and Y arrays. The thermometer value is inverted to the X-array but remains uninverted on the Y array. The lower array bits are tested to final a calibration value that has X and Y side voltages balanced.

21 Claims, 12 Drawing Sheets

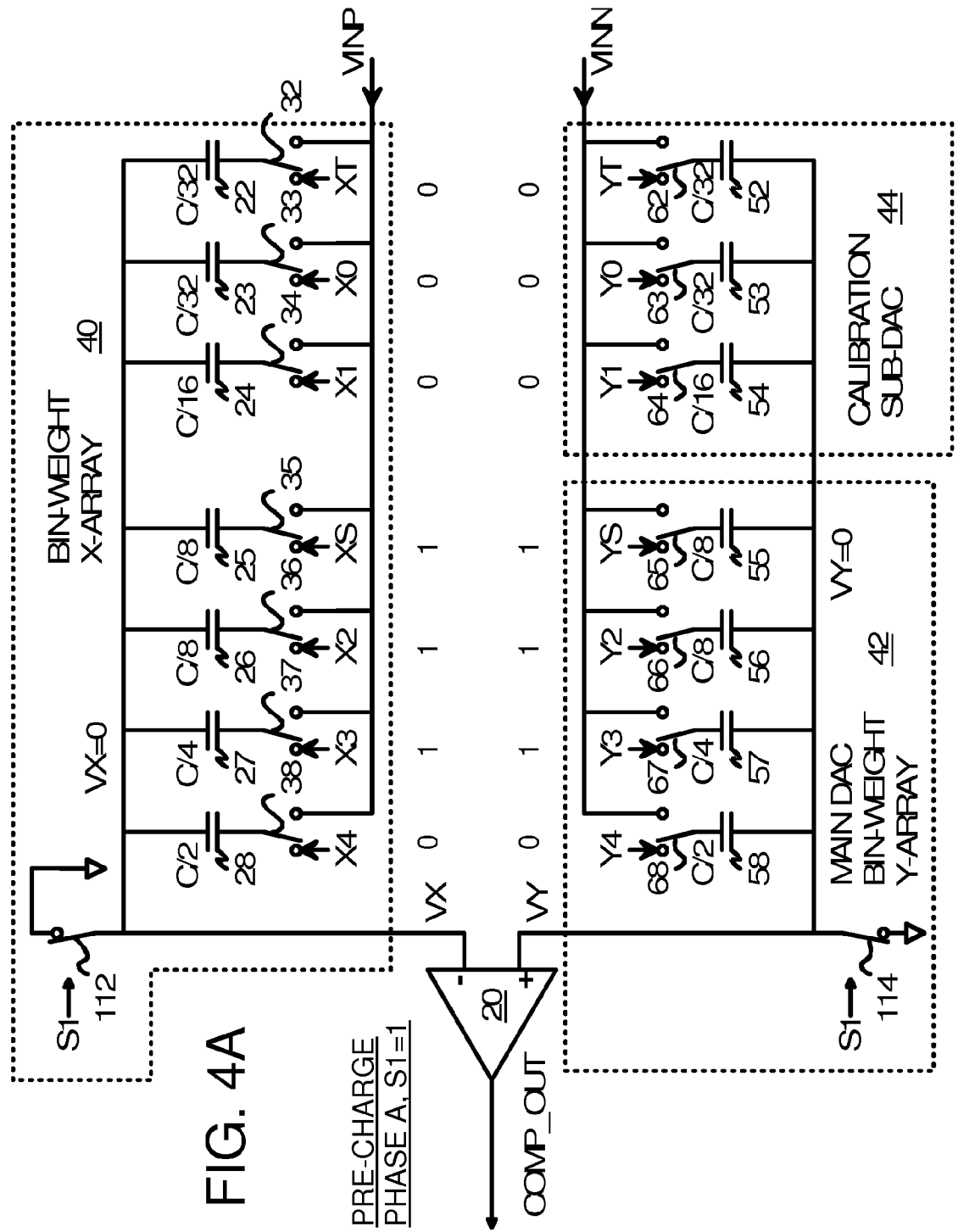

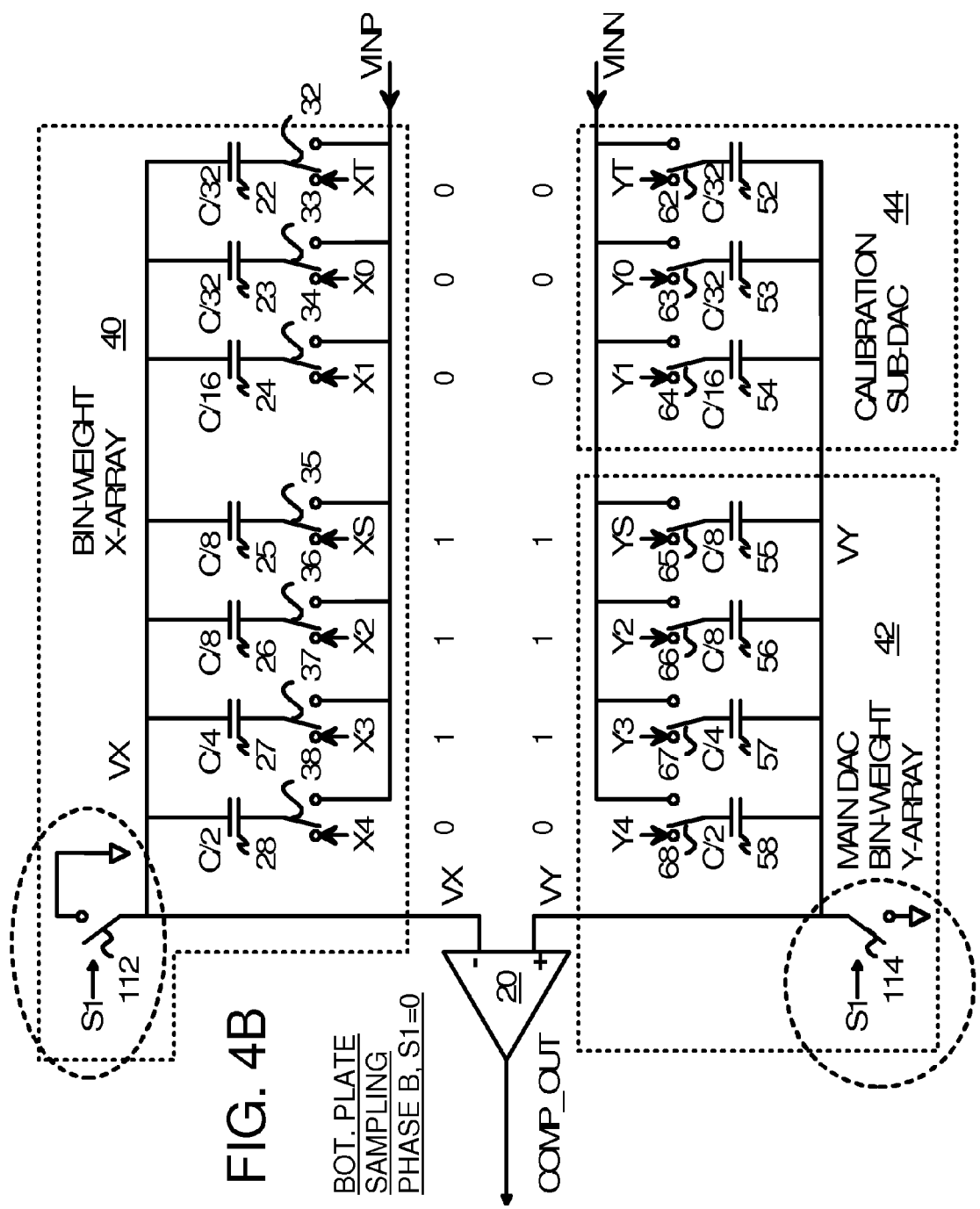

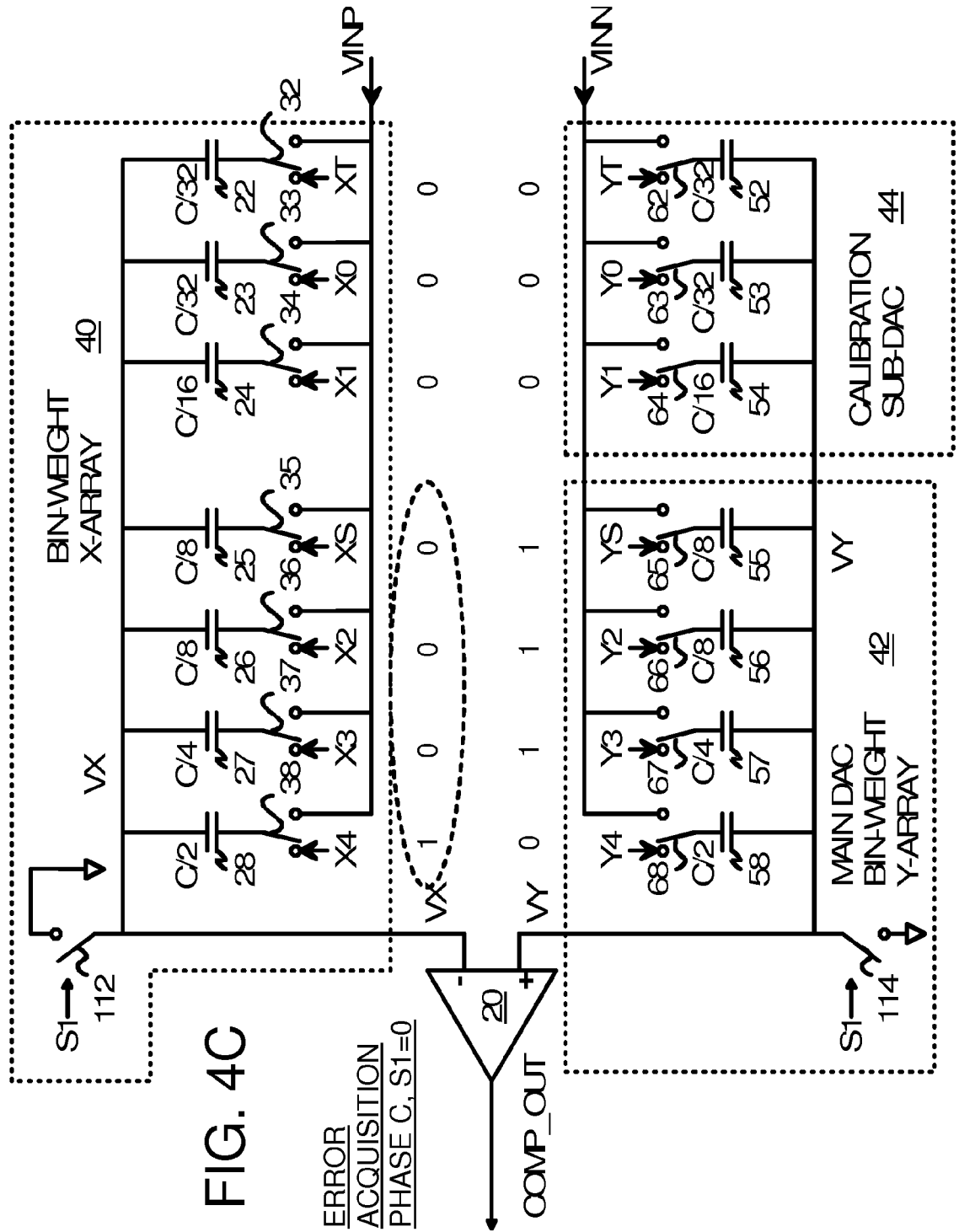

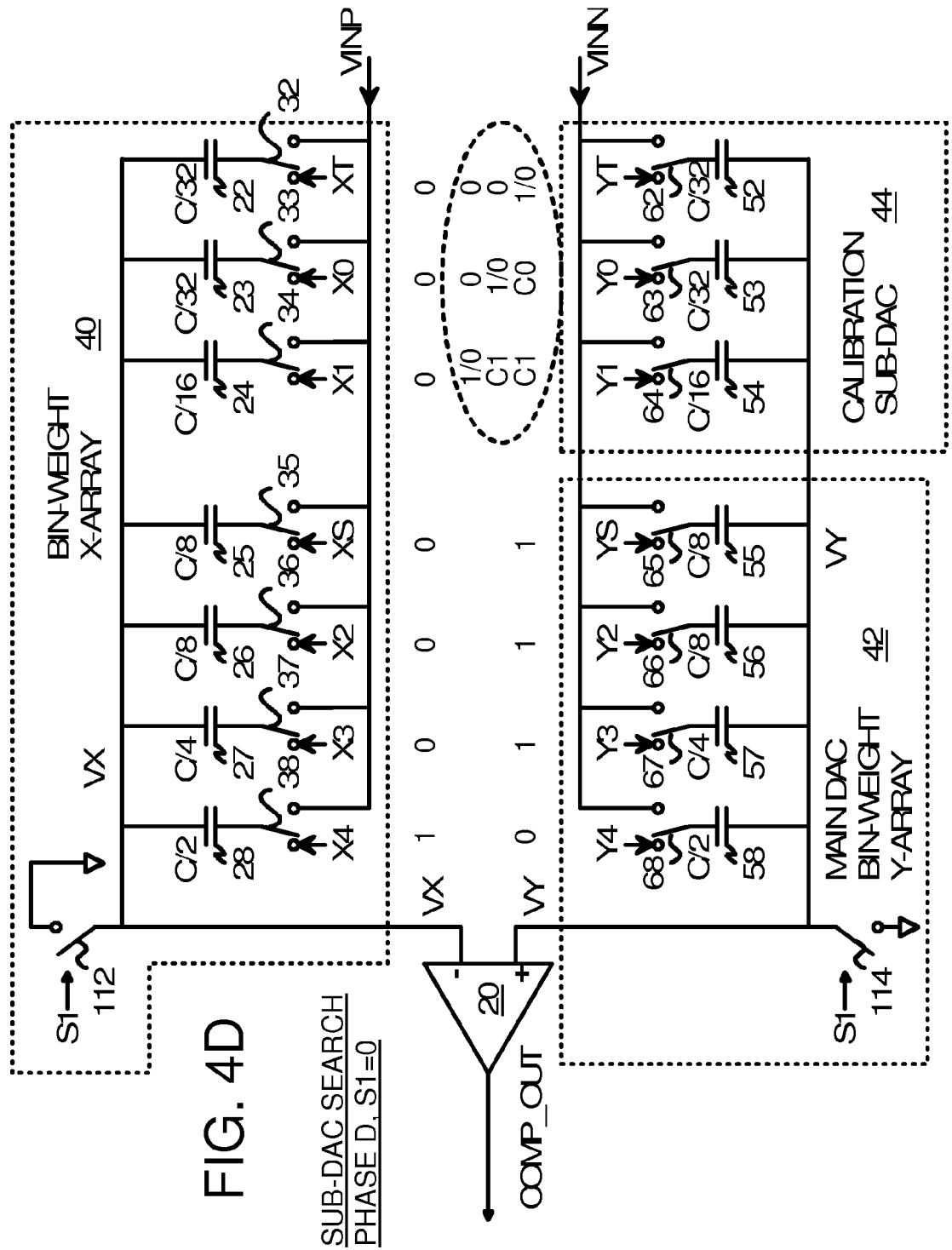

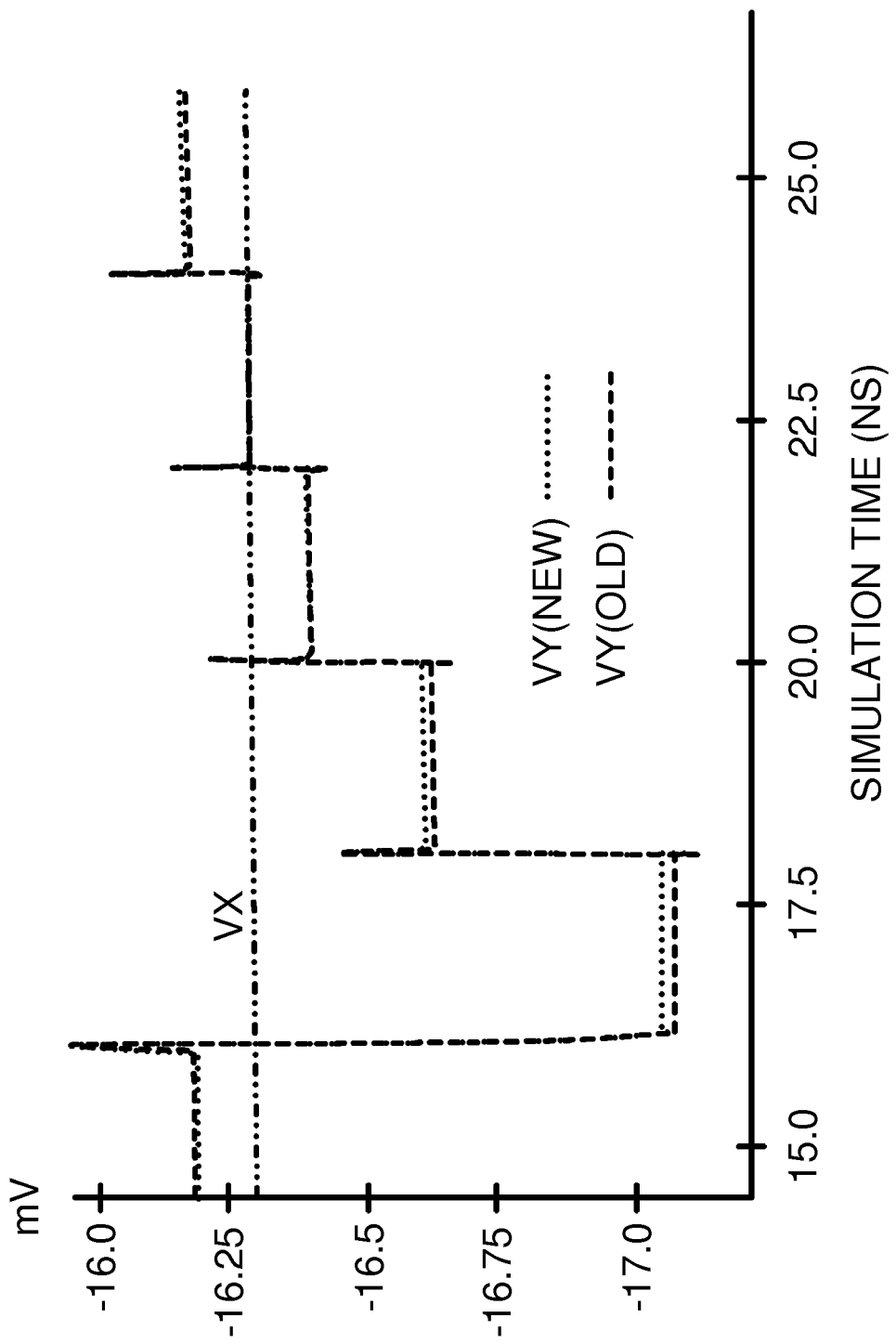

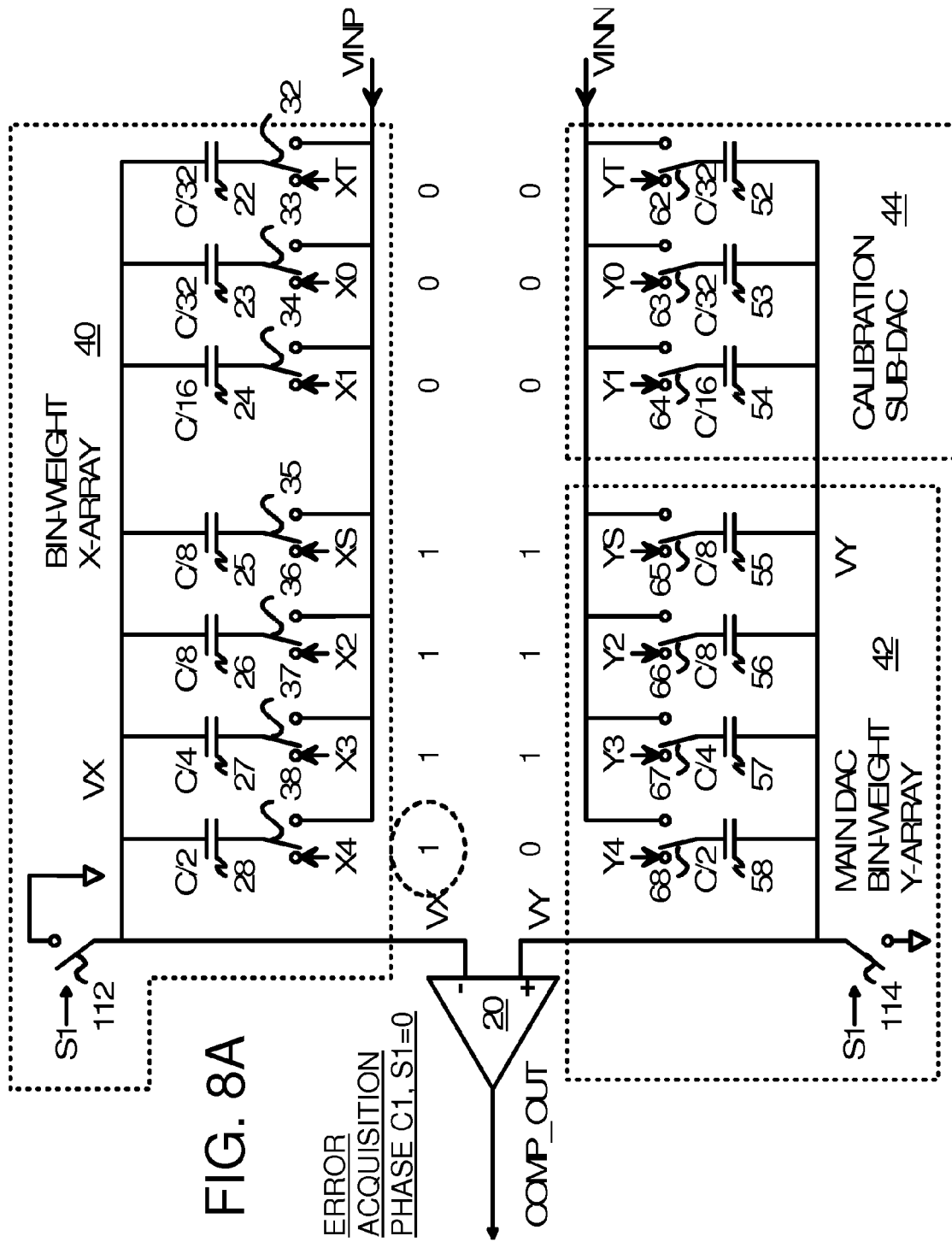

CHARGE COMPENSATION CALIBRATION FOR HIGH RESOLUTION DATA CONVERTER

FIELD OF THE INVENTION

This invention relates to analog-to-digital converters (ADC), and more particularly to calibration methods to improve the precision of successive-approximation register (SAR) ADC's.

BACKGROUND OF THE INVENTION

Both analog and digital circuits are often present in system chips. Signals may cross from the digital domain to the analog domain, and vice-versa. Analog signals may be converted to digital for complex digital processing, such as by a Digital Signal Processor (DSP).

Many types of Analog-to-Digital Converters (ADC's) have been used for a wide variety of applications. Flash ADC's compare analog signal voltages to multiple voltage levels in an instant to produce a multi-bit digital word that represents the analog voltage. Successive-approximation ADC's use a series of stages to convert an analog voltage to digital bits. Each stage compares an analog voltage to a reference voltage, producing one digital bit. In sub-ranging ADC's, each stage compares an analog voltage to several voltage levels, so that each stage produces several bits. Succeeding stages generate lower-significant digital bits than do earlier stages in the pipeline.

Algorithmic, re-circulating, or recycling ADC's use a loop to convert an analog voltage. The analog voltage is sampled and compared to produce a most-significant digital bit. Then the digital bit is converted back to analog and subtracted from the analog voltage to produce a residue voltage. The residue voltage is then multiplied by two and looped back to the comparator to generate the next digital bit. Thus the digital bits are generated over multiple cycles in the same comparator stage.

FIG. 1 shows a Successive-Approximation-Register ADC. Successive-Approximation-Register SAR 102 receives a clock CLK and contains a register value that is changed to gradually zero-in on a close approximation of the analog input voltage VIN. For example, the value in SAR 102 may first be 0.5, then 0.25, then 0.375, then 0.312, then 0.281, then 0.296, then 0.304, then 0.308, then 0.31, then 0.311, and finally 0.312 when comparing to a VIN of 0.312 volts. SAR 102 outputs the current register value to digital-to-analog converter (DAC) 100, which receives a reference voltage VREF and converts the register value to an analog voltage VA.

The input analog voltage VIN is applied to sample-and-hold circuit 104, which samples and holds the value of VIN. For example, a capacitor can be charged by VIN and then the capacitor isolated from VIN to hold the analog voltage. The sampled input voltage from sample-and-hold circuit 104 is applied to the inverting input of comparator 106. The converted analog voltage VA is applied to the non-inverting input of comparator 106.

Comparator 106 compares the converted analog voltage VA to the sampled input voltage and generates a high output when the converted analog voltage VA is above the sampled VIN, and the register value in SAR 102 is too high. The register value in SAR 102 can then be reduced.

When the converted analog voltage VA is below the sampled input voltage, comparator 106 generates a low output to SAR 102. The register value in SAR 102 is too low. The register value in SAR 102 can then be increased for the next cycle.

The register value from SAR 102 is a binary value of N bits, with D(N−1) being the most-significant-bit (MSB) and D0 being the least-significant-bit (LSB). SAR 102 can first set the MSB D(N−1), then compare the converted analog voltage VA to the input voltage VIN, then adjust the MSB and/or set the next MSB D(N−2) based on the comparison. The set and compare cycle repeats until after N cycles the LSB is set. After the last cycle, the end-of-cycle EOC signal is activated to signal completion. A state machine or other controller can be used with or included inside SAR 102 to control sequencing.

DAC 100 or sample-and-hold circuit 104 may have an array of capacitors. The capacitors have binary-weighted values, such as 1, 2, 4, 8, 16, 32, ... times a minimum capacitor size. For example, a 6-bit DAC may have an array of capacitors of 1, 2, 4, 8, 16, 32 times a minimum capacitance C. Higher-resolution DAC's such as a 11-bit DAC have much larger capacitor values, such as $2^{N-1}=1024$.

FIG. 2 is a graph showing a SAR ADC resolving an input voltage. The register value in SAR 102 is initially set to one-half, or 10000. Comparator 106 determines that the input voltage VIN is less than the converted value from SAR 102, so in the next iteration SAR 102 is set to one-quarter, or 01000. Comparator 106 determines that the input voltage VIN is greater than the converted value from SAR 102, so in the third iteration SAR 102 is set to three-eighths, or 01100. Comparator 106 determines that the input voltage VIN is less than the converted value from SAR 102 in the third iteration, so in the fourth iteration SAR 102 is set to five-sixteenths, or 01010. Now comparator 106 determines that the input voltage VIN is greater than the converted value from SAR 102, so in the fifth iteration SAR 102 is set to 5/32, or 01011. The final comparison is that VIN is above the converted value, so the final result is 01011.

While such capacitor-array DAC's are useful, the large size of the MSB capacitors requires a large amount of charge to be transferred. The minimum capacitor size C can be shrunk to reduce the overall capacitance of the capacitor array and thus reduce the dynamic power requirements. The minimum capacitor size may be restricted by the process technology. For example, a sub-micron process may allow for a 4×4 µm2 minimum physical-size for a metal-to-metal capacitor, which has a capacitance of about 16 fF.

Matching capacitor values in the binary-weighted array is very important for obtaining precise results. Inherent device and impedance mismatches in deep sub-micron processes limit converter resolutions to about 10 bits.

Resolution can be increased through calibration. Before the input voltage is converted to a digital value, a sequence of steps known as calibration can be performed. Calibration measures each capacitor's mismatches by charge sharing with an additional array of capacitors. Capacitors in the additional array are connected and disconnected until a voltage match occurs. A mis-match value is obtained by recording the enable signals for the capacitors once the final voltage match occurs.

The procedure is then repeated for the next capacitor in the main array, and its mis-match value stored. Once the calibration procedure has operated upon all capacitors in the main array, the mis-match values are saved for each of the capacitors as capacitor coefficients. These capacitor coefficients can then program the second array to subtract out the mis-match errors as the analog input voltage VIN is processed. As successively smaller capacitors are evaluated in the main array, their saved capacitor coefficient are applied to the second capacitor array.

ADC error measurements such as Integral Non-Linearity (INL) and Differential Non-Linearity (DNL) can be increased through calibration. Another source of errors is charge injection and clock feed-through caused by switches that connect and disconnect capacitors. Clock feed-through can be different for the main array and for the calibration array of capacitors, thus introducing voltage imbalances and measurement errors. When the switching sequences differ, errors measurement may occur.

What is desired is an ADC with a calibration sub-DAC to measure capacitor mis-match errors. A method of operating a SAR ADC with a calibration sub-DAC is desired to obtain calibration coefficients and improve precision. A calibration procedure for a precision ADC is desired.

BRIEF DESCRIPTION OF THE DRAWINGS

FIGS. 4A-D highlight calibration of the SAR ADC of FIG. 3.

FIG. 5 is a graph showing a reduced offset voltage that provides for more accurate calibration.

FIGS. 8A-B shows splitting the error acquisition phase into two phases.

DETAILED DESCRIPTION

The present invention relates to an improvement in calibration of SAR ADC's. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 3:
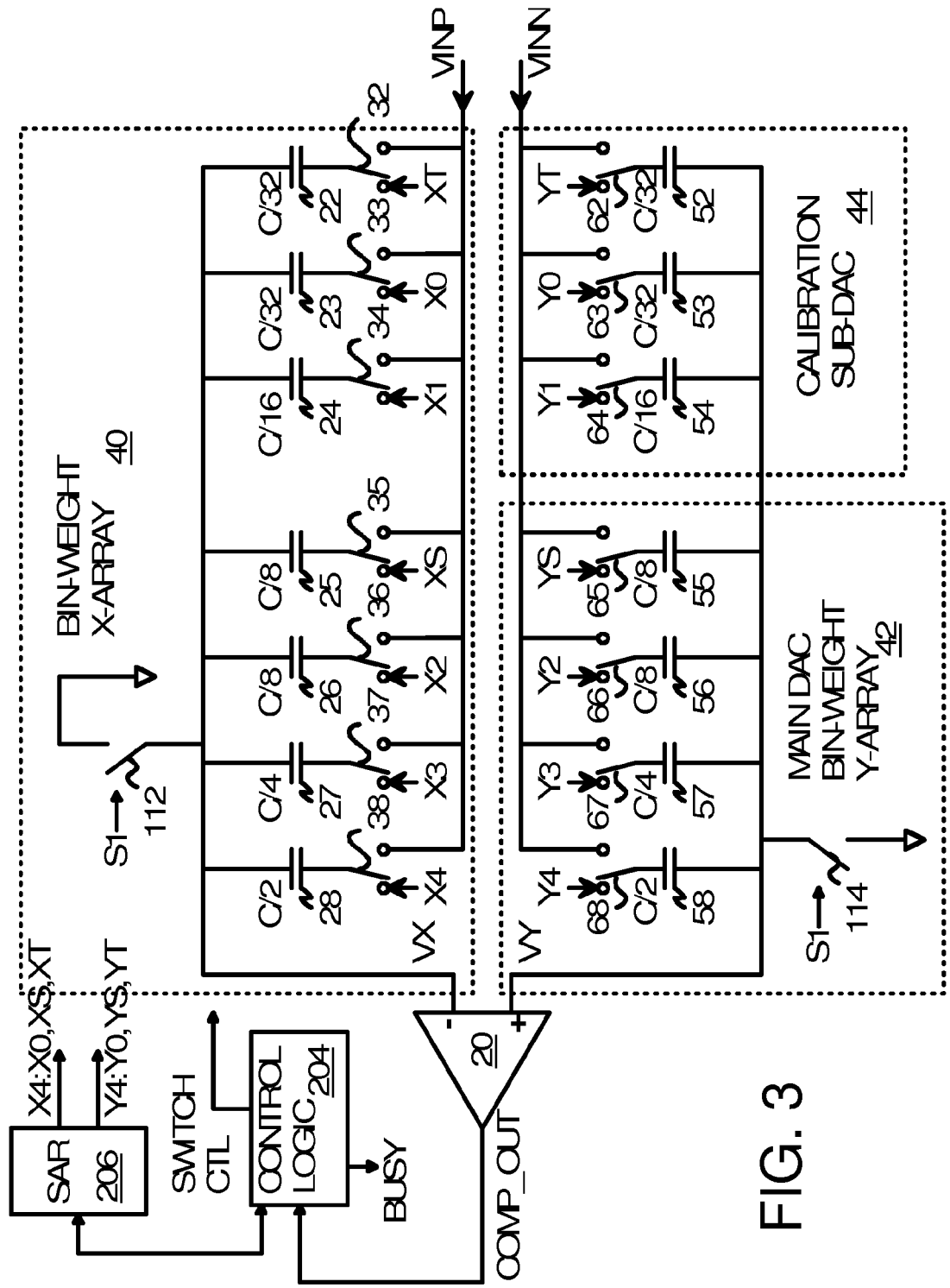
FIG. 3 is a diagram of a SAR ADC with binary-weighted capacitor arrays and a calibration sub-DAC capacitor array.

FIG. 3 is a diagram of a SAR ADC with binary-weighted capacitor arrays and a calibration sub-DAC capacitor array. Binary-weighted X-side capacitor array 40 has capacitors 22-28 that connect to node VX that carries voltage VX to the inverting input of comparator 20.

The non-inverting input of comparator 20 connects to the Y-side capacitor array which is logically divided into two parts. The Y-side most-significant-bits (MSBs) Y4:Y2 and the surrogate bit YS are applied to switches 68-65 in binary-weighted Y-side capacitor array 42, while the least-significant-bits (LSBs) Y1, Y0 and the termination bit YT are applied to switches 64-62 in calibration sub-DAC array 44.

Binary-weighted Y-side capacitor array 42 has capacitors 55-58 that connect to node VY that carries voltage VY to the non-inverting input of comparator 20. Calibration sub-DAC array 44 has three additional capacitors 52-54 that also connect to node VY.

Binary-weighted X-side capacitor array 40 has 2 more bits than the resolution of the ADC, due to surrogate capacitor 25 and termination capacitor 22. The resolution of the ADC is two less than the number of binary bits stored in Successive-Approximation-Register (SAR) 206. SAR 206 stores surrogate bit XS and termination bit XT in addition to binary bits X4:X0. SAR 206 also stores the Y-side bits Y4:Y0, YS, YT.

Before a differential analog input voltage VINP, VINN, is converted to a digital value, a calibration procedure is performed. The calibration procedure first finds the mis-match errors for each of capacitors 28-22 in binary-weighted X-side capacitor array 40 and stores the error coefficients for each of the X-side capacitors. Then the calibration process is reversed and performed on capacitors 58-52 in binary-weighted Y-side capacitor array 42 and calibration sub-DAC array 44, and the resulting Y-side error coefficients stored for each of the Y-side capacitors.

Once calibration is completed, normal operation occurs in which analog voltages are converted to digital values. The error coefficients are used to successively program switches 54-52 in calibration sub-DAC array 44 to subtract the mis-match errors as each of X-side capacitors 28-25 are evaluated.

During normal operation, binary-weighted X-side capacitor array 40 has switches 32-38 that switch input voltage VINP to the bottom plate of capacitors 22-28 during a VIN sampling phase S1, and switch bits X4:X0, XS, XT from SAR 206 during a conversion phase. Grounding switch 112 closes during sampling phase S1 and is open during the conversion phase. The top plates of capacitors 22-28 are connected to the non-inverting input of comparator 20 and generate voltage VX.

Capacitors 22-28 increase in binary weights or multiples of the minimum capacitor size C/32, with capacitance C/32 for termination capacitor 22 and capacitor 23, capacitance C/16 for capacitor 24, and capacitances of C/8 for capacitor 26 and surrogate capacitor 25. Capacitors 28, 27 have capacitances of C/2 and C/4. The capacitor size and arrangement in binary-weighted X-side capacitor array 40 on the X-side is matched by that in binary-weighted Y-side capacitor array 42 and calibration sub-DAC array 44 on the Y-side.

The X-side bits X4:X0, XS, XT from SAR 206 are applied to the bottom plates of capacitors 22-28 in binary-weighted X-side capacitor array 40 during the conversion phase. The bottom plates are grounded during the sampling phase S1 of normal operation. Switches (not shown) may be used, or SAR 206 may output ground signals for X4:0, XS, XT during sampling phase S1. Control logic 204 can generate control signals such as S1 and adjust values in SAR 206 in response to compare results from comparator 20. Once all bits in SAR 206 have been adjusted, a busy signal can be negated to indicate that conversion is complete.

Binary-weighted Y-side capacitor array 42 and calibration sub-DAC array 44 have switches 62-68 that switch input voltage VINN to the bottom plate of capacitors 62-68 during a first sampling phase, and switch bits Y4:Y0, YS, YT from SAR 206 during a conversion phase of normal operation. Grounding switch 114 closes during sampling phase S1 and is open during the conversion phase. The top plates of capacitors 52-58 are connected to the inverting input of comparator 20 and generate voltage VY.

Figure 1:
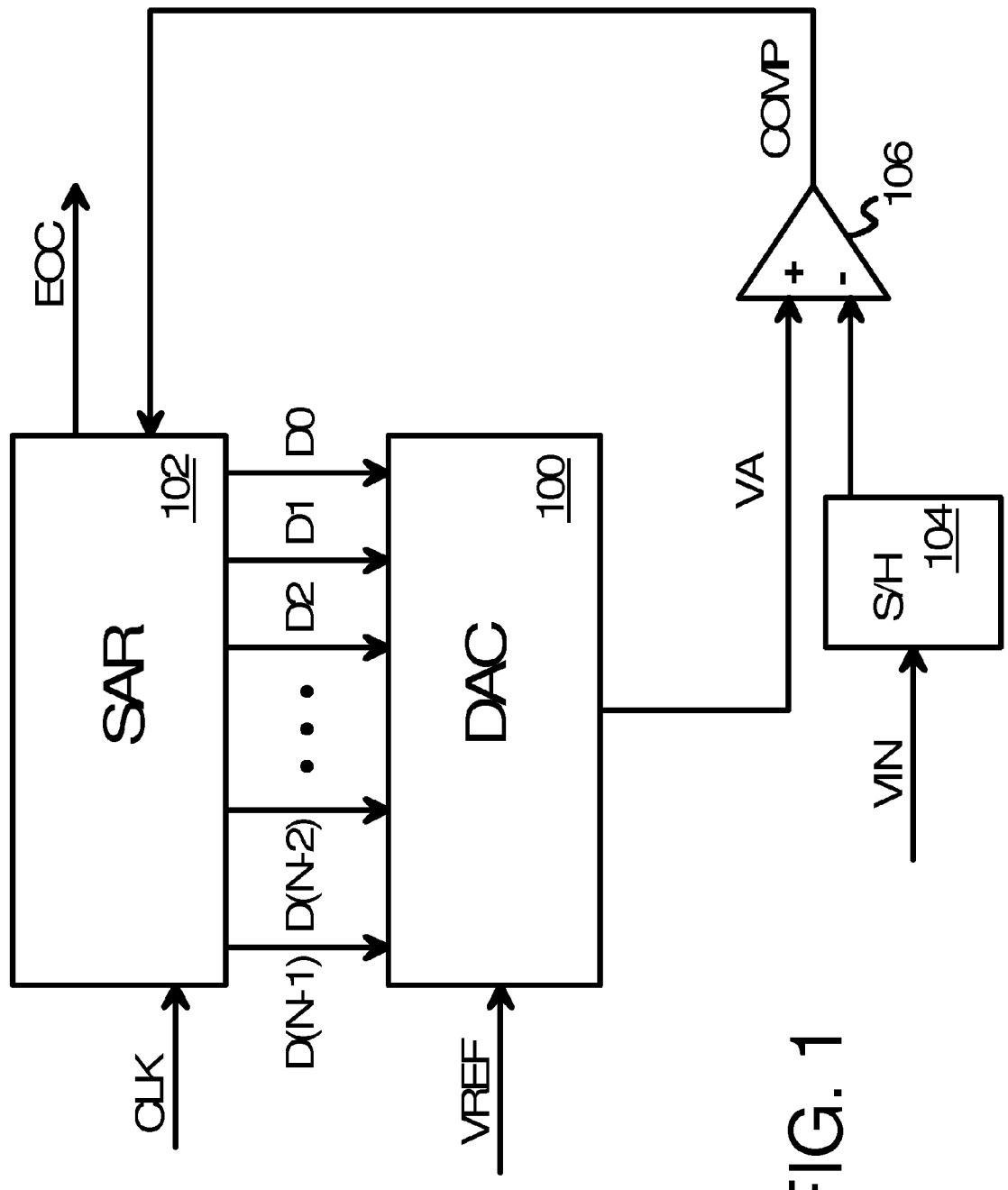
FIG. 1 shows a Successive-Approximation-Register ADC.
Figure 2:
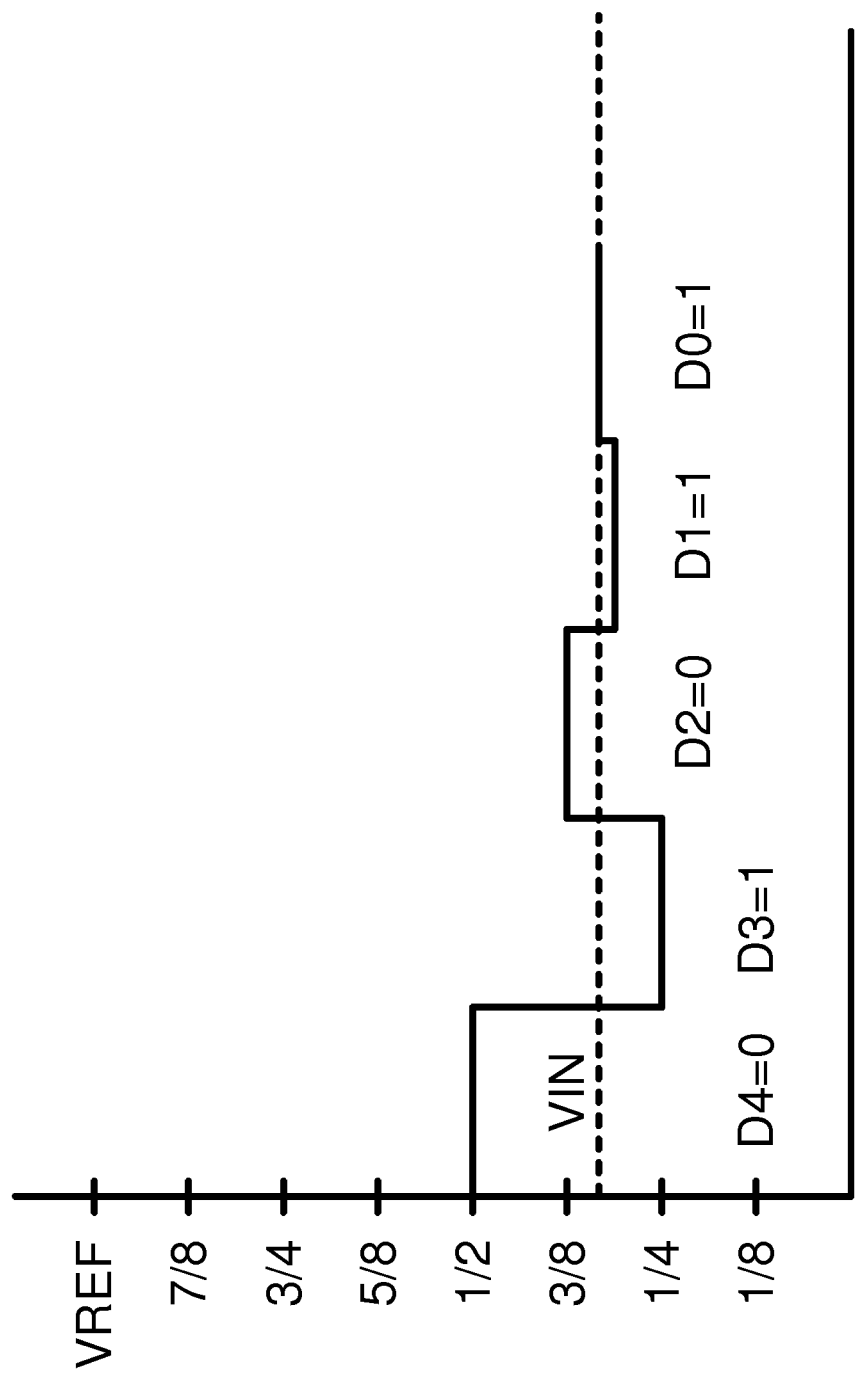
FIG. 2 is a graph showing a SAR ADC resolving an input voltage.

During normal operation, a differential analog input voltage is applied to inputs VINP, VINN. If a single-ended analog voltage were used, it could be applied to VINP and a fixed voltage such as ground or VDD/2 could be applied to VINN. Binary-weighted X-side capacitor array 40 can act as sample-and-hold circuit while binary-weighted Y-side capacitor array 42 and calibration sub-DAC array 44 act as DAC 100 of FIG. 1.

SAR 206 can store 2 copies of each MSB, such as X4 and Y4, or these can be the same bit or be adjusted such as by the error coefficients (calibration value). Y4 and X4 can be the same value during the conversion; however, Y4 and X4 will become 1 and 0 pairs or 0 and 1 pairs after the comparison decision has been made by the control logic. This is because this architecture is used for fully differential inputs in which a pair of inputs swing differentially.

FIGS. 4A-D highlight calibration of the SAR ADC of FIG. 3. A pre-charge phase is shown in FIG. 4A. A bottom-plate sampling phase is shown in FIG. 4B. An error acquisition phase is shown in FIG. 4C, and a sub-DAC search phase is shown in FIG. 4D. These four phases are then repeated and X and Y sides swapped to calibrate capacitors on the Y side. The differential input VINP, VINN is not sampled during any of the phases of calibration but remain isolated from the capacitors by switches 32-38 and 62-68.

In FIG. 4A, the calibration pre-charge phase, grounding switches 112, 114 are closed by phase signal S1, grounding charge-sharing lines VX, VY. These lines could be equalized by a transistor or other switch between them if desired (not shown).

The value from SAR 206 is pre-set to 0111000 and is applied to both the X and Y sides as X4:X2,XS,X1:X0,XT to control switches 28-22 in binary-weighted X-side capacitor array 40, and as Y4:Y2,YS,Y1:Y0,YT to control switches 68-62 in binary-weighted Y-side capacitor array 42 and calibration sub-DAC array 44.

In FIG. 4B, during the calibration bottom-plate sampling phase, S1 is low and grounding switches 112, 114 are opened, floating nodes VX, VY and allowing their voltages to change as charge is shared. The values from SAR 206 are kept at the same values as in the prior phase (FIG. 4A), or 0111000.

The opening of grounding switches 112, 114 causes some charge to be injected onto lines VX, VY. This injected charge from switches 112, 114 can cause an error that reduces precision during normal operation. However, the calibration procedure described herein attempts to capture and calibrate this switch-injection error.

In FIG. 4C, during the calibration error acquisition phase, S1 remains low and grounding switches 112, 114 remain open, floating nodes VX, VY. The values from SAR 206 to switches 28-25 invert from 0111 to 1000 to push and pull charge from node VX through capacitors 28-25. This allows calculation of the mismatch error between the MSB and the (MSB-1 to LSB) capacitors. The control values to switches 24-22 do not change, nor do the Y values.

The changed high and low voltages of the binary values X4:X2 and XS cause charge to be moved or shared between capacitors attached to charge-sharing line VX. The voltage of VX changes in response to the binary values. The capacitor mis-match and switch feed-through errors are captured onto line VX during this phase.

In FIG. 4D, the digital value for the error captured onto the VX line during the prior error-acquisition phase is converted to a digital value.

The value in SAR 206 is successively changed to test out digital values until a best match is found. For example, first the MSB within calibration sub-DAC array 44, bit Y1, is set and all LSB's (Y0, YT) cleared to zero. When comparator 20 shows that VX is larger than VY, the analog voltage was overshot and the MSB Y1 is cleared and stored as calibration coefficient C1 and the next MSB Y0 set and comparison repeated. When comparator 20 shows that VX is not greater than VY, then the MSB Y2 is left set (C1=1) and the next MSB Y1 tested. Successively lower significant bits are tested until the LSB YT is tested and the final value for SAR 206 is found.

The calibration error coefficients C1, C0 are stored as the error coefficients for capacitor 28.

The process of FIGS. 4A-D is then repeated to determine the error coefficients for the next smaller capacitor in binary-weighted X-side capacitor array 40, capacitor 27. In FIGS. 4A-B, the value of 0011000 is applied to both X and Y sides, rather than 0111000. The previously-calibration upper bit X4 remains high, but the next upper bits X3:X2, XS are inverted in FIG. 4C and then the values of Y1, Y0, YT are sequenced until comparator 20 finds that VX=VY to find the error coefficients for second capacitor 27.

The process of FIGS. 4A-D is then repeated a third time to determine the error coefficients for the next smaller capacitor in binary-weighted X-side capacitor array 40, capacitor 26. In FIGS. 4A-B, the thermometer-code value of 0001000 is applied to both X and Y sides. X4, X3 remain high since their capacitors have already been calibrated. The remaining upper bits X2, XS are inverted in FIG. 4C and then the values of Y1, Y0, YT are changed to find the error coefficients for third capacitor 26.

The process of FIGS. 4A-D is repeated for all remaining capacitors, up to and including the surrogate capacitor 25, for a total of 4 iterations, or N−1, where N is the ADC resolution. The thermometer code value applied to the upper array in binary-weighted X-side capacitor array 40 is initially 0111, then 0011, then 0001, then 0000, to calibrate the four capacitors in the upper array of binary-weighted X-side capacitor array 40.

Error coefficients are also calculated for lower capacitors 24, 23, 22. Error coefficients are stored for each capacitor in binary-weighted X-side capacitor array 40.

Then the overall process is repeated, but with the X and Y sides swapped. This first obtains the error coefficients for capacitor 68 in binary-weighted Y-side capacitor array 42, the for second capacitor 67, and on through surrogate capacitor 65 in binary-weighted Y-side capacitor array 42.

FIG. 5 is a graph showing a reduced offset voltage that provides for more accurate calibration. An input voltage of about 16.2 mV is applied to line VX and converted to a digital value in steps that switch successively smaller capacitors, such as described earlier. Using the new calibration process produces more accurate calibration coefficients, resulting in less charge injection into VY. Better impedance matching of the injected charge due to the grounding gate switches results in an improvement of overall accuracy to about ¼ rather than ½ of the LSB value.

Figure 6:
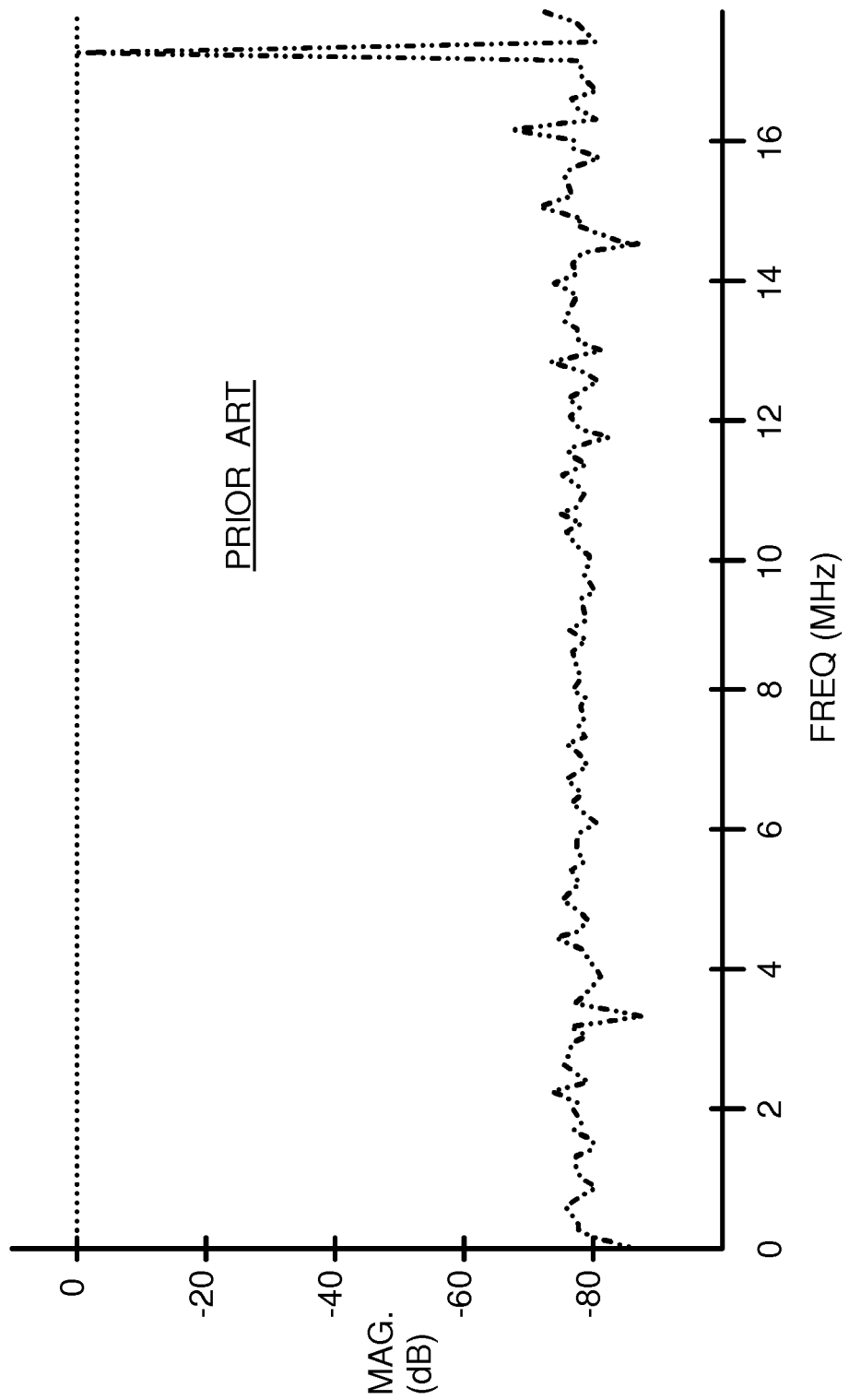
FIG. 6 is a plot of signal to noise for a prior-art ADC.

FIG. 6 is a plot of signal to noise for a prior-art ADC. The signal-to-noise ratio is about 56.3 dB, and the Effective Number of Bits (ENOB) is 9.1 for a 9-bit SAR-DAC, which may be used with a 12-bit SAR-ADC. Without impedance matching, the signal-to-noise ration is high.

Figure 7:
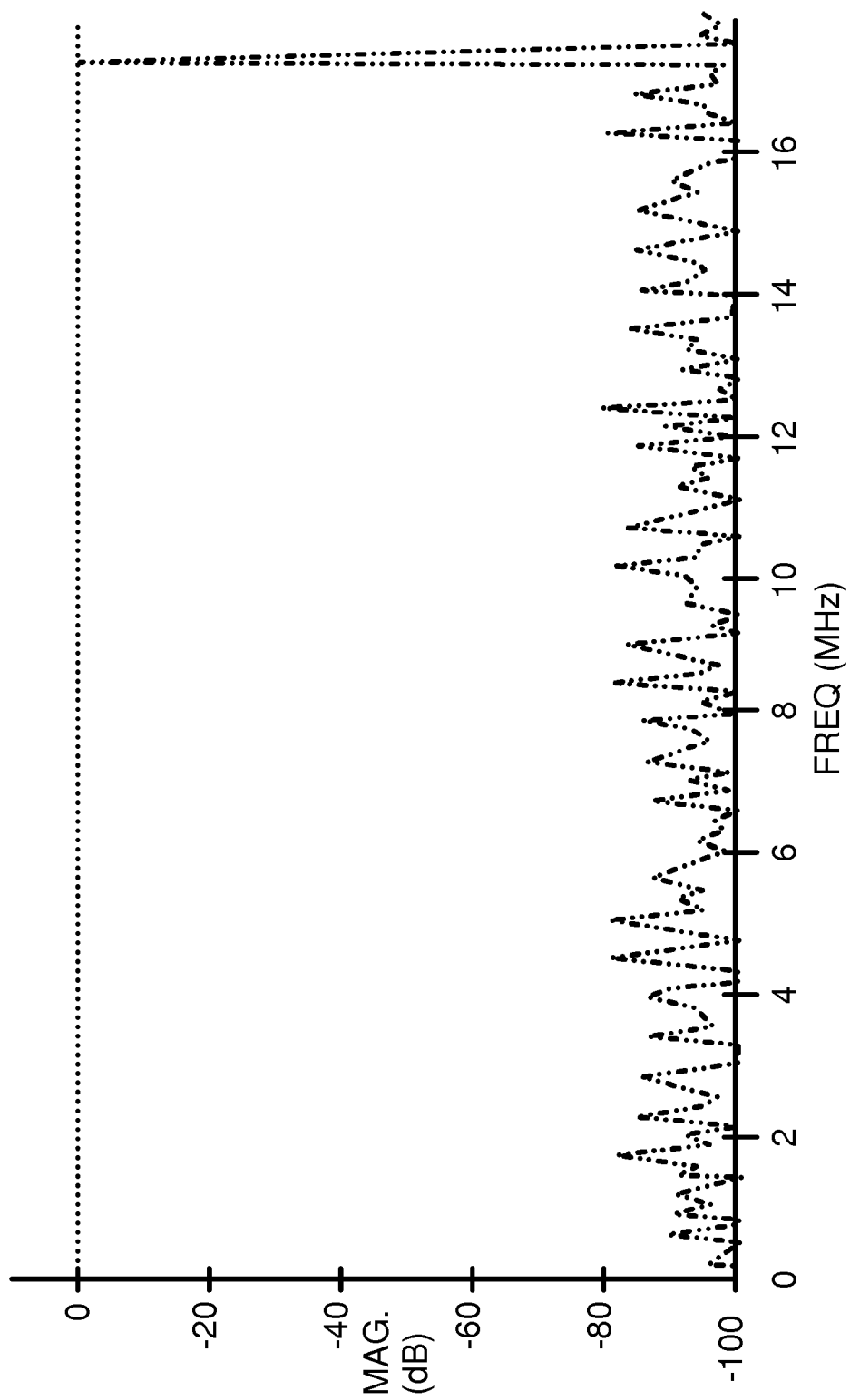
FIG. 7 is a plot of signal to noise for the ADC using the calibration procedure of FIGS. 4A-D.

FIG. 7 is a plot of signal to noise for the ADC using the calibration procedure of FIG. 4. The signal-to-noise ratio is about 67.9 dB, and ENOB is 11.0. This is a substantial improvement due to impedance matching. An 11-bit SAR-DAC may be supported for a 14-bit SAR-ADC.

Figure 8B:
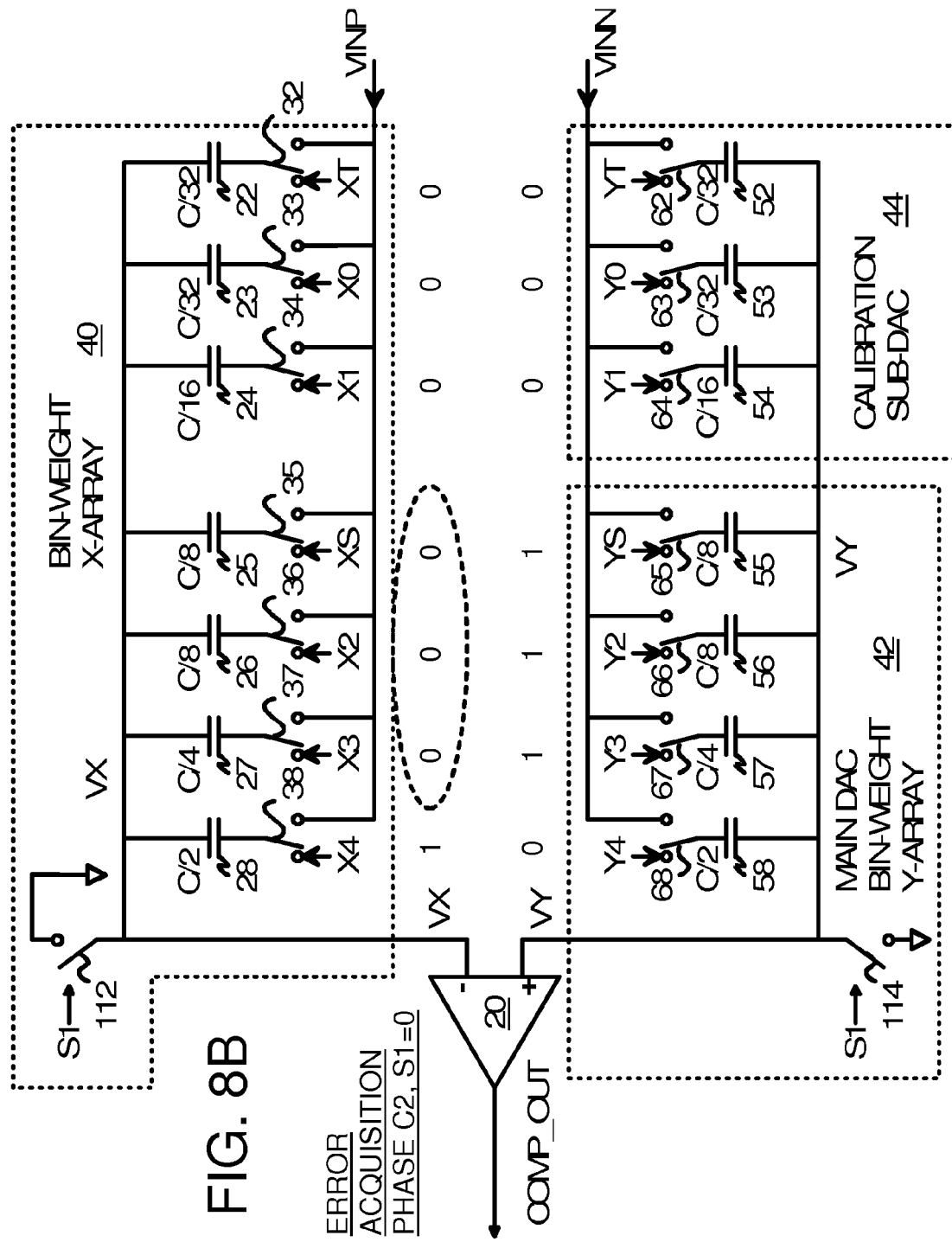

FIGS. 8A-B shows splitting the error acquisition phase into two phases. The body diode at the bottom plate diode can be prevented from turning on momentarily by switching the MSB high first, before switching the LSB's to ground. The error acquisition phase of FIG. 4C is divided into the two phases C1, C2 shown in FIGS. 8A, 8B in this embodiment.

In FIG. 8A, phase C1 of the error acquisition phase, the MSB, X4, is switched from 0 to 1. The LSB's X3:X2, XS remain high. When the MSB is switched from low to high, charge sharing through MSB capacitor 28 can boost the voltage on node VX higher. This provides a voltage margin above ground to prevent the body diode from turning on when the 3 LSB's are switched low in the next phase.

In FIG. 8B, phase C2 of the error acquisition phase, the LSB's X3:X2, XS are switched from high to low. Noise is reduced by switching the MSB's and LSB's in separate phases.

Alternate Embodiments

Several other embodiments are contemplated by the inventors. For example rather than have a fully binary-weighted capacitor array, a combination of a binary-weighted capacitor array and a non-weighted capacitor array can provide a desired resolution while still reducing total capacitance and dynamic power. While an application in a SAR ADC has been described, the circuit and calibration steps may be used for other applications and systems.

Rather than have a separate phase to open grounding switches 112, 114 as shown in FIGS. 4B, 4C, the bottom-plate sampling phase could be combined with the error acquisition phase, so that grounding switches 112, 114 open at the same time that the values of X4:X2,XS,X1:X0,XT are changed. This embodiment may be less immune to noise but is simpler from a control standpoint.

The number of bits in binary-weighted X-side capacitor array 40, binary-weighted Y-side capacitor array 42, and calibration sub-DAC array 44 may be adjusted. For example, a 15 bit ADC with a resolution of 9 bits could have 9 capacitors Y13:6 and YS in binary-weighted Y-side capacitor array 42, and 7 capacitors Y4:0, YT in calibration sub-DAC array 44. Binary-weighted X-side capacitor array 40 would have capacitors for X13:X6, XS, X5:0, XT, with sizes 1/2,1/4, 1/8, 1/16, 1/32, 1/64, 1/128, 1/256, 1/256 (surrogate capacitor), 1/512, 1/1024, 1/2048, 1/4096, 1/8192, 1/16384, and 1/16384 (terminal capacitor). A 6-bit calibration coefficient could be stored for each upper capacitor. The smallest coefficient, the control for the terminal capacitor, may be discarded in some embodiments.

Binary-weighted X-side capacitor array 40 could be considered to contain two arrays, a binary-weighted X-side capacitor array and an X-side calibration sub-DAC array. Likewise, binary-weighted Y-side capacitor array 42 and calibration sub-DAC array 44 could be considered to be a single Y-side array.

Rather than a top-down approach, where the MSB capacitor is calibrated first, then the next MSB, and repeated until the LSB capacitor is calibrated last, a bottom-up sequence could be substituted, where the LSB capacitor is calibrated first, and the MSB capacitor is calibrated last.

Both differential and single-ended analog voltages may be converted. A single-ended analog voltage may be applied to one differential input, while a reference voltage is applied to the other differential input.

The binary-weighted capacitor array could be thermometer-weighted or use gray codes or some other weighting arrangement. The binary bits from SAR 206 can be merged with other control or timing information, such as from control logic 204 or a sequencer or multi-phase non-overlapping clock.

The number of bits in the register value in SAR 206 can be adjusted to achieve the desired accuracy. For example, when N is 16 bits and VREF is 2 volts, the LSB represents 30 micro-volts, which is the precision of the ADC. A different number of bits could be substituted for a different precision, and the number of bits could be fixed or could be variable. The calibration sub-DAC sizing may handle the maximum error of the capacitor array and the minimum LSB of the calibration sub-DAC may be ¼ LSB of the ADC converter. In the examples 2 bits are stored for the calibration codes, but other numbers of calibration bits could be substituted for different precisions.

Some embodiments may not use all components. For example, switches may be added or deleted in some embodiments. Different kinds of switches may be used, such as 2-way switches or 3-way switches. Muxes may be used as switches. Input resistors could be added to VINP, VINN or more complex input filters used. Multiple levels of switches may be used, such as 2-way switches for switches, and then an overall switch that connects either VDD or GND to these 2-way switches.

While binary-weighted capacitors have been described, other weightings could be substituted, such as decimally-weighted capacitors, prime-weighted capacitors, or linearly-weighted capacitors, or octal-weighted capacitors. The digital value could be in these other number systems, such as octal numbers rather than binary numbers.

Inversions may be added by swapping inverting and non-inverting inputs as desired, but do not change the overall function and thus may be considered equivalents. The digital values that pass through the switches during the conversion phase could be applied directly to the switches as either data that passes through the switches or as control of the switches. More complex switches could use the digital values to generate high and low voltages that are applied to the capacitors by the complex switches. Other embodiments of connecting the digital values to the capacitors through the switches are possible.

The resistance and capacitance values may vary in different patterns. Capacitors, resistors, and other filter elements may be added. Switches could be n-channel transistors, p-channel transistors, or transmission gates with parallel n-channel and p-channel transistors, or more complex circuits, either passive or active, amplifying or non-amplifying.

Additional components may be added at various nodes, such as resistors, capacitors, inductors, transistors, etc., and parasitic components may also be present. Enabling and disabling the circuit could be accomplished with additional transistors or in other ways. Pass-gate transistors or transmission gates could be added for isolation.

Inversions may be added, or extra buffering. The final sizes of transistors and capacitors may be selected after circuit simulation or field testing. Metal-mask options or other programmable components may be used to select the final capacitor, resistor, or transistor sizes. Capacitors may be connected together in parallel to create larger capacitors that have the same fringing or perimeter effects across several capacitor sizes.

Comparison of a reference voltage to a single analog voltage could be used, or a differential analog voltage could be compared. The differential input voltage could be latched and then the latched single-ended voltage compared to the DAC voltage. The first voltage could be sampled by a capacitor; then the second voltage could be sampled by the same capacitor. The differential charge is stored on another capacitor through the feedback of the amplifier. Another method for comparing differential analog voltages is to put a differential amplifier at the input with a defined gain. While an operational amplifier (op amp) could be used, other kinds of comparators could be used, such as non-amplifying compare buffers.

An equalizing switch could be added between VX and VY. Two grounding switches could be used on the true and complement inputs lines of the inputs to comparator 20.

Rather than grounding, some switches could connect to another fixed voltage, such as VDD or VDD/2.

The background of the invention section may contain background information about the problem or environment of the invention rather than describe prior art by others. Thus inclusion of material in the background section is not an admission of prior art by the Applicant.

Any methods or processes described herein are machine-implemented or computer-implemented and are intended to be performed by machine, computer, or other device and are not intended to be performed solely by humans without such machine assistance. Tangible results generated may include reports or other machine-generated displays on display devices such as computer monitors, projection devices, audio-generating devices, and related media devices, and may include hardcopy printouts that are also machine-generated. Computer control of other machines is another tangible result.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

We claim:

1. A method for calibrating a digital-to-analog converter (DAC) comprising:
during a pre-charge phase:
grounding an X line and grounding a Y line that are inputs to a comparator;
driving a thermometer code to an upper group of binary-weighted capacitors and to a surrogate capacitor that has a same capacitance value as a smallest capacitor in the upper group, for both an X-side array that has all capacitors connected to the X line and for a Y-side array that has all capacitors connected to the Y line;
wherein the thermometer code drives a target capacitor low and drives lower capacitors high in the upper group when calibrating the target capacitor;
wherein the thermometer code also drives low any larger capacitors that have a larger capacitance value than the target capacitor;
driving low all capacitors in a lower group of binary-weighted capacitors and driving low a termination capacitor that has a same capacitance value as a smallest capacitor in the lower group, for both the X-side array and the Y-side array;
during a bottom-plate sampling phase:
floating the X line and the Y line to allow the comparator to compare X and Y-side voltages;
during an error acquisition phase:
inverting the thermometer code applied to the upper group so that the target capacitor and any larger capacitors are driven high and the lower capacitors are driven low in the X-side array;
wherein charge sharing occurs between the target capacitor and the lower capacitors connected through the X line;
continuing to drive the thermometer code to the upper group of the Y-side array;
during a calibration search phase:
driving a test sequence of high and low values onto the lower group of binary-weighted capacitors in the Y-side array;
continuing to drive low all capacitors in the lower group of binary-weighted capacitors and the termination capacitor in the X-side array;
comparing voltages on the X line and the Y line and adjusting the high and low values applied to the lower group until a minimum voltage difference is detected by the comparator; and
storing as a calibration value for the target capacitor the high and low values applied to the lower group of the Y-side array that produced the minimum voltage difference.

2. The method of claim 1 wherein driving the test sequence of high and low values onto the lower group of binary-weighted capacitors in the Y-side array further comprises applying high and low values to the termination capacitor;
wherein the calibration value includes a high or low value applied to the termination capacitor.

3. The method of claim 1 further comprising:
selecting as the target capacitor a different capacitor in the upper group of the X-side array and repeating from the pre-charge phase to the calibration search phase to obtain a calibration value for the different capacitor;
selecting other capacitors in the upper group until calibration values are stored for all capacitors in the upper group.

4. The method of claim 3 further comprising:
selecting as the target capacitor the surrogate capacitor in the upper group of the X-side array and repeating from the pre-charge phase to the calibration search phase to obtain a calibration value for the surrogate capacitor.

5. The method of claim 4 further comprising:
calibrating all capacitors in the upper group of the Y-side array by repeating all steps with X-side and Y-side arrays reversed in all steps.

6. The method of claim 3 further comprising:
decreasing the thermometer code for each capacitor selected as the target capacitor,
wherein the thermometer code is a descending code.

7. The method of claim 3 further comprising:
wherein during the error acquisition phase, initially driving high all capacitors in the upper group before an inversion of the thermometer code is applied to the upper group;
wherein the target capacitor and any larger capacitors are driven high before the lower capacitors are driven low in the X-side array;
whereby switch feed through disturbances are reduced.

8. The method of claim 3 wherein the bottom-plate sampling phase and the error acquisition phase occur simultaneously as one phase.

9. The method of claim 3 wherein the thermometer code drives the target capacitor high and drives the lower capacitors low in each array when calibrating a largest capacitor.

10. The method of claim 3 further comprising:
after calibration values are stored, converting an analog input to a digital value by applying the analog input to the binary-weighted capacitors in the X-side array during a sampling phase and applying the calibration values to the lower group in the Y-side array during an evaluation phase,
whereby calibration values applied to the lower group of capacitors adjust conversion of the analog input to the digital value.

11. The method of claim 3 wherein driving high comprises driving to a first voltage and wherein driving low comprises driving to a second voltage;
wherein the first voltage is a ground and the second voltage is a high voltage, or wherein the first voltage is the high voltage and the second voltage is the ground, wherein high and low are inverted.

12. A calibrating Analog-to-Digital Converter (ADC) comprising:
Successive-Approximation-Register (SAR) means for storing a digital value of M+N+2 significant bits;
wherein M and N are whole numbers and M is at least 4;
first analog input means for receiving a first analog voltage;
first sharing node means for generating a first compare voltage;
first upper binary-weighted capacitor array means for switching charge to the first sharing node means in response to M+1 bits of digital values from the SAR means that are applied to capacitors having capacitance values of $2^{i+N}$ times C, wherein C is a minimum capacitance value and i is a whole number between 0 and M;
first upper switch means for connecting the first analog input means to capacitors in the first upper binary-weighted capacitor array means during a sampling phase, and for connecting M+1 digital values from the SAR means to capacitors in the first upper binary-weighted capacitor array means during a conversion phase after the sampling phase;
wherein the first upper binary-weighted capacitor array means further comprises two capacitors each having a lowest upper capacitance value of $2^N$ times C but controlled by different significant bits from the SAR means;
first lower binary-weighted capacitor array means for switching charge to the first sharing node means in response to N+1 bits of digital values from the SAR means that are applied to capacitors having capacitance values of $2^i$ times C, wherein C is a minimum capacitance value and i is a whole number between 0 and N;
first lower switch means for connecting the first analog input means to capacitors in the first lower binary-weighted capacitor array means during a sampling phase, and for connecting N+1 digital values from the SAR means to capacitors in the first binary-weighted capacitor array means during a conversion phase after the sampling phase;
wherein the first lower binary-weighted capacitor array means further comprises two capacitors each having the minimum capacitance value of C but controlled by different significant bits from the SAR means;
first grounding switch means for grounding the first sharing node means during the sampling phase;
second analog input means for receiving a second analog voltage;
second sharing node means for generating a second compare voltage;
second upper binary-weighted capacitor array means for switching charge to the second sharing node means in response to M+1 bits of digital values from the SAR means that are applied to capacitors having capacitance values of $2^{i+N}$ times C, wherein C is a minimum capacitance value and i is a whole number between 0 and M;
second upper switch means for connecting the second analog input means to capacitors in the second upper binary-weighted capacitor array means during a sampling phase, and for connecting M+1 digital values from the SAR means to capacitors in the second upper binary-weighted capacitor array means during a conversion phase after the sampling phase;
wherein the second upper binary-weighted capacitor array means further comprises two capacitors each having a lowest upper capacitance value of $2^N$ times C but controlled by different significant bits from the SAR means;
second lower binary-weighted capacitor array means for switching charge to the second sharing node means in response to N+1 bits of digital values from the SAR means that are applied to capacitors having capacitance values of $2^i$ times C, wherein C is a minimum capacitance value and i is a whole number between 0 and N;
second lower switch means for connecting the second analog input means to capacitors in the second lower binary-weighted capacitor array means during a sampling phase, and for connecting N+1 digital values from the SAR means to capacitors in the second binary-weighted capacitor array means during a conversion phase after the sampling phase;
wherein the second lower binary-weighted capacitor array means further comprises two capacitors each having the minimum capacitance value of C but controlled by different significant bits from the SAR means;
second grounding switch means for grounding the second sharing node means during the sampling phase;
compare means for comparing the first compare voltage to the second compare voltage to generate a compare output; and
sequencing means for adjusting the digital value stored in the SAR means in response to the compare output.

13. The calibrating ADC of claim 12 further comprising:
first calibration means for generating first calibration values for each capacitor in the first upper binary-weighted capacitor array means, the first calibration values applied to the second lower switch means during the sampling phase to offset mismatches in capacitance values and switch noise;
second calibration means for generating second calibration values for each capacitor in the second upper binary-weighted capacitor array means, the second calibration values applied to the first lower switch means during the sampling phase to offset mismatches in capacitance values and switch noise,
whereby calibration values are generated and applied to offset mismatches.

14. The calibrating ADC of claim 13 further comprising:
pre-charge calibration means for applying a stepping code to both the first upper switch means and to the second upper switch means during a pre-charge calibration phase, and for applying a fixed voltage to capacitors connected to the first lower switch means and to the second lower switch means during the pre-charge calibration phase, and for controlling the first and second grounding switch means to ground the first sharing node means and the second sharing node means;

error acquisition calibration means for controlling the first and second grounding switch means to float the first sharing node means and the second sharing node means, and for inverting the stepping code applied to the first upper switch means while still applying the stepping code to the second upper switch means during an error acquisition calibration phase;

wherein a target capacitor in the first upper binary-weighted capacitor array means is driven with an inverted voltage when the stepping code is inverted; and search calibration means for applying a sequence of test codes to the second lower switch means and comparing voltages on the first sharing node means and the second sharing node means to find a test code generating a minimum voltage difference between the first sharing node means and the second sharing node means, and storing the test code as a first calibration value for the target capacitor, whereby calibration values are generated by applying the stepping code to both the first and second upper binary-weighted capacitor array means, but inverting the stepping code only to the first upper binary-weighted capacitor array means.

15. The calibrating ADC of claim 14 wherein the stepping code is a thermometer code or a walking-zeros code or a walking ones code.

16. The calibrating ADC of claim 14 wherein M+N+2 is at least 10, wherein the calibrating ADC has a resolution of at least 10 bits.

17. A calibrating converter comprising:

a first charge-sharing line;

a first grounding switch that grounds the first charge-sharing line;

a plurality of first switches;

a first array of capacitors having weighted capacitance values, wherein first array capacitors in the first array connect to the first charge-sharing line and to the plurality of first switches;

a first termination capacitor in the first array of capacitors, the first termination capacitor having a same minimum capacitance value as a minimum capacitor, wherein two capacitors in the first array of capacitors have the same minimum capacitance value;

a first surrogate capacitor in the first array of capacitors, the first surrogate capacitor having a middle capacitance and a first middle capacitor having the middle capacitance, wherein two capacitors in the first array of capacitors have the middle capacitance;

a first upper group of capacitors in the first array of capacitors, the first upper group comprising the first surrogate capacitor and all capacitors in the first array of capacitors having capacitance values greater than the middle capacitance;

a first lower group of capacitors in the first array of capacitors, the first lower group comprising the first termination capacitor and all capacitors in the first array of capacitors having capacitance values less than the middle capacitance;

a first analog input having an analog input voltage, a plurality of first digital values;

wherein the plurality of first switches connect the first analog input to the first array of capacitors during a sampling phase during normal operation;

wherein the plurality of first switches connect the first digital values to the first array of capacitors during a conversion phase after the sampling phase during normal operation;

a second charge-sharing line;

a second grounding switch that grounds the second charge-sharing line;

a plurality of second switches;

a second array of capacitors having weighted capacitance values, wherein second array capacitors in the second array connect to the second charge-sharing line and to the plurality of second switches;

a second termination capacitor in the second array of capacitors, the second termination capacitor having the same minimum capacitance value as the minimum capacitor, wherein two capacitors in the second array of capacitors have the same minimum capacitance value;

a second surrogate capacitor in the second array of capacitors, the second surrogate capacitor having the middle capacitance and a second middle capacitor having the middle capacitance, wherein two capacitors in the second array of capacitors have the middle capacitance;

a second upper group of capacitors in the second array of capacitors, the second upper group comprising the second surrogate capacitor and all capacitors in the second array of capacitors having capacitance values greater than the middle capacitance;

a second lower group of capacitors in the second array of capacitors, the second lower group comprising the second termination capacitor and all capacitors in the second array of capacitors having capacitance values less than the middle capacitance;

a second analog input having an analog input voltage, a plurality of second digital values;

wherein the plurality of second switches connect the second analog input to the second array of capacitors during a sampling phase during normal operation;

wherein the plurality of second switches connect the second digital values to the second array of capacitors during a conversion phase after the sampling phase during normal operation;

a comparator that receives the first compare voltage and compares the first compare voltage to a second comparator input to generate a compare output; and control logic for adjusting the first digital values to the plurality of first switches and for adjusting the second digital values to the plurality of second switches.

18. The calibrating converter of claim 17 further comprising:

a calibration controller for generating calibration values for each capacitor in the first upper group of capacitors in the first array of capacitors, the calibration values representing capacitance value mismatches;

wherein the calibration controller further comprises:

precharge calibration phase means for closing the first and second grounding switches and applying an isolating code through the plurality of first switches to the first upper group of capacitors and applying the isolating code through the plurality of second switches to the second upper group of capacitors;

wherein the isolating code isolates a target capacitor for calibration;

bottom plate sampling phase means for opening the first and second grounding switches;

error acquisition phase means for inverting the isolating code to generate an inverted isolating code, and for applying the inverted isolating code through the plurality of first switches to the first upper group of capacitors while still applying the isolating code through the plurality of second switches to the second upper group of capacitors;

wherein the plurality of second switches applies a voltage changes to the target capacitor in response to the isolating code changing to the inverting isolating code;

search phase means for applying a sequence of test codes through the plurality of second switches to the second lower group of capacitors, and for storing as the calibration values for the target capacitor a test code in the sequence of test codes that produces a minimum voltage difference detected by the comparator.

19. The calibrating converter of claim 18 further comprising:

further comprising:

a Successive-Approximation-Register (SAR) that stores the first digital values and the second digital values;

wherein the control logic updates the first digital value in the SAR during a first sequence of compare operations during normal operation;

wherein the SAR outputs the first digital values as a final digital value that represents the analog input voltage at an end of sequences of compare operations.

20. The calibrating converter of claim 18 wherein the isolating code is a descending thermometer code or an ascending thermometer code.

21. The calibrating converter of claim 18 wherein the plurality of first switches comprises M+N+2 switches;

wherein the first array of capacitors comprises M+1 capacitors in the first upper group and N+1 capacitors in the first lower group;

wherein the plurality of second switches comprises M+N+2 switches;

wherein the second array of capacitors comprises M+1 capacitors in the second upper group and N+1 capacitors in the second lower group;

wherein M is a whole number of at least 5;

wherein N is a whole number of at least 1.

* * * * *